(12) United States Patent
Yen et al.

(10) Patent No.: US 7,813,908 B2
(45) Date of Patent: Oct. 12, 2010

(54) CLOCK CONTROL MODULE SIMULATOR AND METHOD THEREOF

(75) Inventors: Jen-Tien Yen, Austin, TX (US); Jeff B. Golden, Austin, TX (US); Richard G. Woltenberg, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 685 days.

(21) Appl. No.: 11/741,251

(22) Filed: Apr. 27, 2007

(65) Prior Publication Data

US 2008/0270099 A1 Oct. 30, 2008

(51) Int. Cl.
*G06F 17/50* (2006.01)
(52) U.S. Cl. .................. 703/14; 703/18; 716/4
(58) Field of Classification Search .............. 703/2, 703/13, 14, 18; 716/4, 6
See application file for complete search history.

(56) References Cited

U.S. PATENT DOCUMENTS

| | | | |
|---|---|---|---|
| 6,415,416 B1 * | 7/2002 | Fujiwara et al. ............. | 716/2 |
| 6,954,865 B2 | 10/2005 | Kalambur et al. | |
| 7,216,159 B2 * | 5/2007 | Hirose et al. ............... | 709/223 |
| 2002/0073381 A1 * | 6/2002 | Fujiwara et al. ............. | 716/1 |
| 2005/0192787 A1 * | 9/2005 | Kuwahara et al. ........... | 703/18 |
| 2005/0278560 A1 | 12/2005 | Wu | |
| 2007/0245278 A1 * | 10/2007 | Chen .......................... | 716/5 |

OTHER PUBLICATIONS

Vahedi et al., H. Power-Smart System-on-Chip Architecture for Embedded Cryptosystems, Third IEEE/ACM Hardware/Software Codesign and Systems Synthesis, Sep. 2005, pp. 184-189.*

* cited by examiner

*Primary Examiner*—Russell Frejd

(57) ABSTRACT

A method for simulating an integrated circuit having a plurality of clock control modules includes simulating the integrated circuit, and automatically receiving from each clock control model during simulation an indication of a simulated power state of the clock control model. Accordingly, the simulated power state of the portion of the integrated circuit model to be clocked by a clock control model can be monitored based on the indicator from the clock control model, rather than on a higher level analysis of the simulated input/output behavior of the integrated circuit model.

20 Claims, 5 Drawing Sheets

|         | M1 | M2 | M3 | M4 | M5 |
|---------|----|----|----|----|----|
| CCM 302 | E  | D  | E  | E  | E  |
| CCM 303 | E  | D  | E  | E  | E  |
| CCM 304 | E  | D  | D  | E  | E  |
| CCM 305 | E  | D  | E  | D  | E  |
| CCM 306 | E  | D  | E  | D  | D  |
| CCM 307 | E  | D  | E  | D  | E  |

*FIG. 5*

|          | M1 | M2 | M3 | M4 | M5 |
|----------|----|----|----|----|----|
| CCM 302  | E  | D  | E  | E  | E  |
| CCM 303  | E  | E  | E  | E  | E  |
| CCM 304  | E  | D  | D  | D  | E  |
| CCM 305  | D  | E  | E  | E  | E  |
| CCM 306  | E  | E  | E  | E  | D  |
| CCM 307  | E  | D  | E  | E  | E  |
| CCM_NEW  | D  | E  | E  | D  | E  |

*FIG. 6*

CLOCK CONTROL MODULE SIMULATOR AND METHOD THEREOF

FIELD OF THE DISCLOSURE

The present disclosure is related to simulation of devices and more particularly to simulation of clock control devices.

BACKGROUND

Integrated circuits, such as data processors, can use simple and complex device modules corresponding to millions of logic gates, making them very complex. Because of their complexity, building such integrated circuits is typically expensive and time consuming. Accordingly, in the design of these devices it is not normally feasible to build hardware prototypes for testing each revision to a design. Thus, integrated circuit simulations are employed to provide a simulated representation, i.e. a software prototype, of the device modules making up the integrated circuit. Simulated output data based on the simulation can be analyzed to determine if the functional operation predicted by the simulation matches an expected functional operation of the device modules without incurring the expense of building a hardware design prototype.

During operation, simulation models receive data at simulated inputs and provide data at simulated outputs for use by other simulation models. By monitoring the simulated inputs and outputs various states of models can be determined. However, for a large number of models, or possible state conditions, monitoring simulated inputs and outputs can become burdensome. Accordingly, there is a need for an improved device simulation method.

BRIEF DESCRIPTION OF THE DRAWINGS

FIG. 5 is a diagram of a particular embodiment of a power mode specification associated with the hardware device of FIG. 1;

FIG. 6 is a diagram of a particular embodiment of simulation results associated with the netlist of FIG. 1;

DETAILED DESCRIPTION

A method and device for simulating an integrated circuit having a plurality of clock control modules is disclosed. The method includes simulating the integrated circuit, and automatically receiving from each clock control model during simulation an indication of a simulated power state of the clock control model. Accordingly, the simulated power state of the portion of the integrated circuit model to be clocked by a clock control model can be monitored based on the indicator from the clock control model, rather than on a higher level analysis of the simulated input/output behavior of the integrated circuit model.

Figure 1:
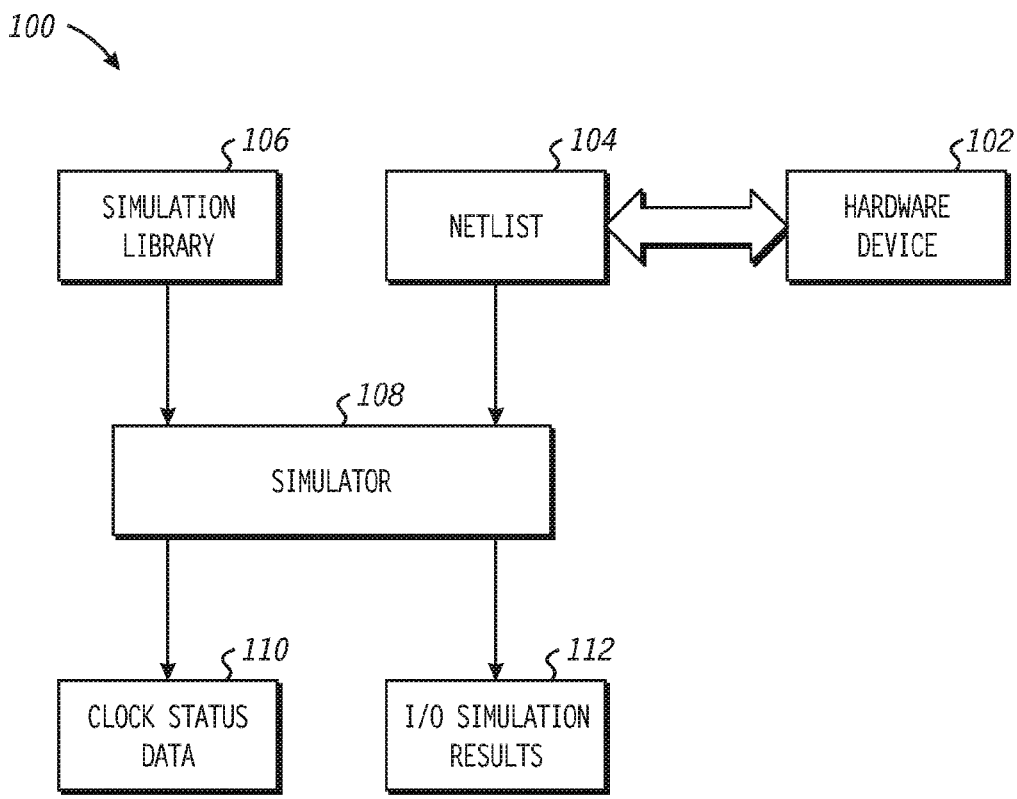
FIG. 1 is a block diagram of a particular embodiment of simulator device.

Referring to FIG. 1, a block diagram of a particular embodiment of a simulation system 100 is illustrated. The simulation device 100 includes a netlist 104 associated with a hardware device 102. The simulation system 100 also includes a simulation library 106 containing device simulation models of devices listed in netlist 104, a simulator 108, memory storing clock status data 110, and memory storing I/O simulation results 112.

The hardware device 102 represents an integrated circuit that may not yet be fabricated, such as a data processor, e.g. a microprocessor, microcontroller, ASIC, and the like, having a number of logic modules to perform device functions. The logic modules can include logic gates, storage elements, clock drivers, the like, and combinations thereof.

The netlist 104 is a software representation of the hardware device 102, such as a register transfer level (RTL) model, and includes a listing of device simulation models corresponding to the physical modules of the hardware device 102, as well as the relationship between those modules. For example, the netlist 104 can indicate a clock control model corresponds to a clock control module of the hardware device 102. As referred to herein, a clock control module is a physical module of the hardware device 102, while a clock control model is a software representation of a clock control module. The netlist 104 will also set forth how the clock control model interacts with other logic simulation models, such as by indicating input and output connections between the clock control model and other models.

The simulation library 106 is a library of device simulation models available for use in the netlist 104. The entries in the simulation library 106 define the behavior of each device model of the netlist 104. For example, the simulation library 106 can include a simulation model for a clock control module. The clock control model may be better understood with reference to FIG. 2.

Figure 2:
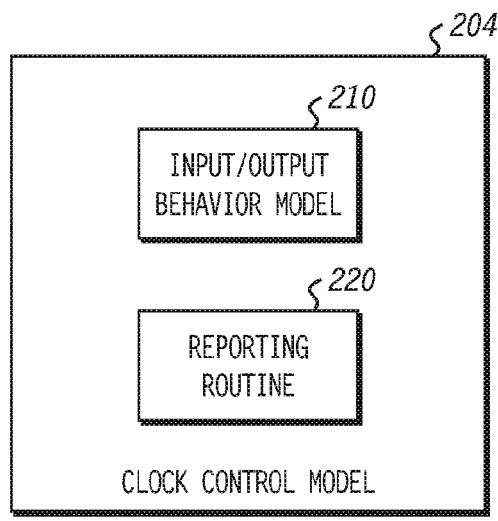
FIG. 2 is a block diagram of a particular embodiment of clock control model of the simulation library of FIG. 1.

FIG. 2 illustrates a clock control model 204 of the simulation library 106. The clock control model 204 includes an input/output behavior model 210 and a reporting routine 220. During simulation, the input/output behavior model 210 is used by the simulator 108 to simulate the functional input/output behavior of each instantiation of a clock control module of this type in the device 102 which can be provided to the I/O simulation results 112. During simulation, the reporting routine 220 of each instantiation monitors its power state and automatically provides the power state to the clock status data 110. As used herein, the term "automatically" indicates that the power state is reported from a specific instantiation of a device model, independent of any probing or monitoring of the simulated input and output signals of the device model that may occur outside of the specific instantiation. Accordingly, the power state of each instantiation of a clock control model in a design is automatically provided to the clock status data 110 during simulation, allowing for direct reporting and analysis of the power state for each clock control model in the netlist 104.

The simulator 108 is a simulation tool configured to simulate operation of the hardware device 102 based on the netlist 104. The simulator 108 can simulate the operation of the hardware device 102 based upon specified input stimuli (not shown). These stimuli result in different simulated power modes, corresponding to the power modes of the device. The simulator 108 can be a software simulation tool operating on a desktop computer, workstation, server or other computer hardware.

To simulate the operation, the simulator 108 accesses the netlist 104 to determine the logic models to be simulated, as well as the relationship between the logic models. The simulator 108 uses the simulation library 106 to determine the behavior of each logic model, and determines the input and output data for each model based on that behavior. The input and output data is recorded in the I/O simulation results 112. The I/O simulation results 112 is a data file or other data collection representing the simulated input and output data associated with the netlist 104 in each of the simulated power modes.

The clock status data 110 is a data file that is updated during simulation by a reporting mechanism of the simulation model that receives the simulated power status of the clock control models of the netlist 104. The simulated power status can be provided to clock status data 110 from a clock control model for each change in the simulated power mode simulated by that model. Accordingly, the simulated power states for the clock control models are reported automatically and directly, and can be determined without analysis of the I/O simulation results 112. Thus, the clock status data 110 provides a simple way to monitor the current behavior of each instantiation of a clock control model, allowing the clock status data 110 to be analyzed to determine if the simulated behavior of the netlist 104 matches a behavior set forth in a device specification, thereby simplifying design qualification.

In addition, the behavior of other portions of the netlist 104 can be based on the behavior of the clock control models. For example, if a clock control model is in an inactive simulated power state, the downstream logic simulation models are also likely to be inactive. Accordingly, the clock status data 110 provides a simplified representation of the power state behavior of the clocked logic devices of the netlist 104, allowing for faster and more accurate analysis of model behavior.

Figure 3:
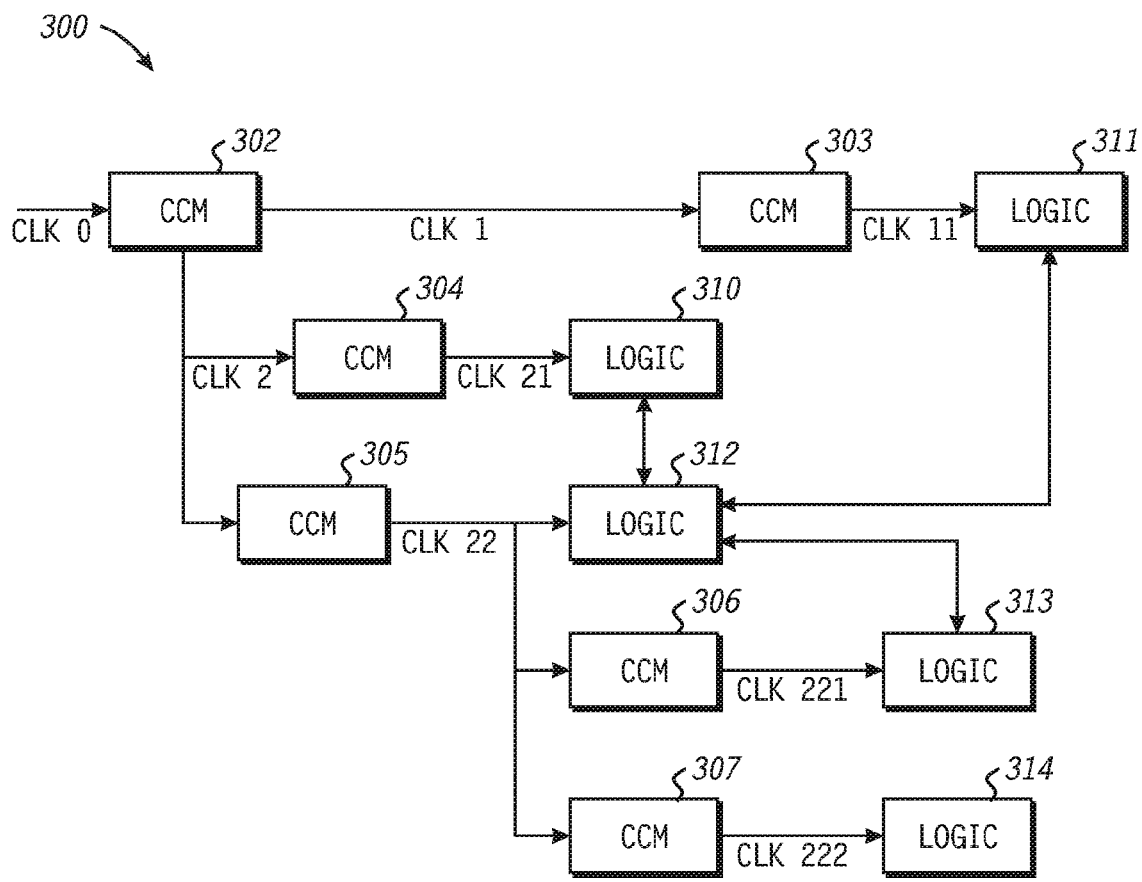
FIG. 3 is a block diagram of a particular embodiment of a simulation model FIG. 1.

Referring to FIG. 3, a block diagram of a particular embodiment of a simulation model 300 is illustrated. The simulation model 300 includes clock control models 302, 303, 304, 305, 306, and 307, and logic models 310, 311, 312, 313, and 314. The clock control model (CCM) 302 includes an input to receive a clock signal CLK0, an output to provide a clock signal CLK1 and an output to provide a clock signal CLK2. The CCM 303 includes an input to receive the clock signal CLK1 and an output to provide a clock signal CLK 11. The CCM 304 includes an input to receive the clock signal CLK2 and an output to provide a clock signal CLK21. The CCM 305 includes an input to receive the clock signal CLK2 and an output to provide the clock signal CLK22. The CCM 306 includes an input to receive the clock signal CLK22 and an output to provide a clock signal CLK221. The CCM 307 includes an input to receive the clock signal CLK22 and an output to provide the clock signal CLK222.

The logic model 310 includes an input to receive the clock signal CLK21 and a bi-directional connection to the logic model 312. The logic model 311 includes an input to receive the clock signal CLK11 and a bi-directional connection with the logic model 312. The logic model 312 includes an input to receive the clock signal CLK22. The logic model 313 includes an input to receive the clock signal CLK221. The logic model 314 includes an input to receive the clock signal CLK222. It will be appreciated that each of the logic models 310-314 and the simulation models 302-307 can include additional inputs and outputs that are not illustrated.

Each of the logic models 310-314 can model either synchronous logic elements, asynchronous logic elements, or both, including storage elements, logic gates, and the like. The logic models 310-314 are listed by the netlist 104. The simulator 108 simulates operation of the logic models 310-314. The simulated inputs and outputs at each of the logic models 310-314 can be provided to the input/output simulation results 112.

The CCMs 302-307 are models that simulate control of an aspect of clock operation. Thus, each of the CCMs 302-307 can simulate a clock gating cell, a phase locked loop, clock generation module, or other type of clock control module.

The input/output behavior model of CCM 302-307 indicates to the simulator 108 the simulated inputs and outputs for each model. The simulator provides this information to the input/output simulation results 112. In addition, the reporting routine of each CCM 302-307 reports a power status for the associated CCM in each simulated power mode. This power status is provided automatically to the clock status data 110, and can be analyzed to directly determine the simulated behavior of the CCMs 302-307.

Figure 4:
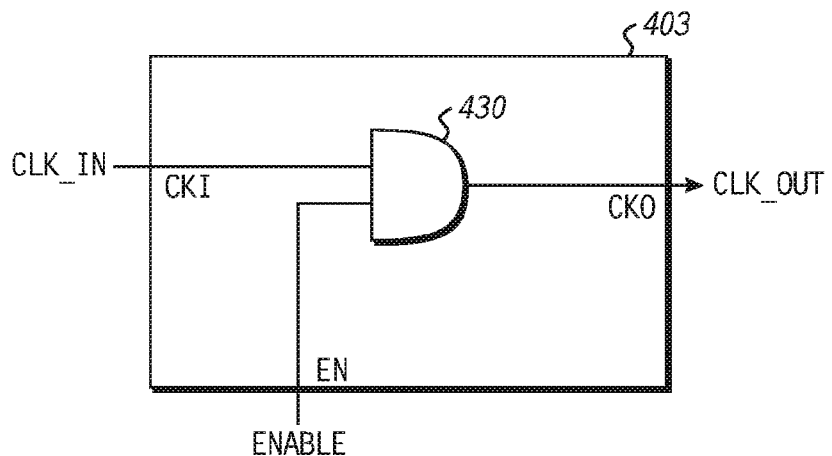
FIG. 4 is a block diagram of a particular embodiment of a clock control module of FIG. 3.

Referring to FIG. 4, a schematic diagram representation of a particular embodiment of an input/output behavioral model of a clock control model 403 that can correspond to the CCM 303 of FIG. 3, is illustrated. The behavioral model 403 includes an input (CK1) to receive a simulated clock signal CLK_N, an input (EN) to receive a simulated control signal (ENABLE) and an output (CKO) to provide a simulated signal CLK_OUT. The schematic representation of the behavioral model 403 also includes an AND gate 430 having an input to connected to the input CK1, an input connected to the input EN, an output connected to the output CKO.

During operation, the state of the signal CLK_OUT is determined by the model of the AND gate 430. When the ENABLE signal is asserted, the state of the signal CLK_OUT depends on the state of the signal CLK_IN. Accordingly, in the enabled state, the behavioral model 403 provides the signal CLK_OUT based upon the clock signal CLK_IN. When the ENABLE signal is negated, the CLK_OUT signal is a logic low signal.

The reporting routine associated with the clock control model 403 monitors changes at the output to meet a definition of a power state. For example the reporting routine can monitor the frequency of changes at the output of the clock control model 403 to determine if the model is in an on state or an off state. In another particular embodiment, the reporting routine monitors the frequency of changes at the output to determine if the clock control model 403 is in a high power state, a medium power state, a low power state, or an off state.

When the behavioral model 303 is simulated by the simulator 108, the simulated power state reported by the reporting routine of the clock control model depends on the state of the signal CLK_OUT. For example, when the signal CLK_OUT is providing a clock signal the simulated power state of the clock control model associated with the behavioral model 303 is recognized as a power enable state and when the CLK_OUT signal is not providing a clock signal, the simulated power state of the clock control model is recognized as a power disable state. Changes in the simulated power state of the clock control model associated with the behavioral model 303 are provided automatically from the reporting routine of the clock control model as described with respect to FIG. 2. Accordingly, the simulated input/output behavior of the behavioral model does not have to be analyzed to determine the clock control model's simulated power state.

Figures 7, 8:
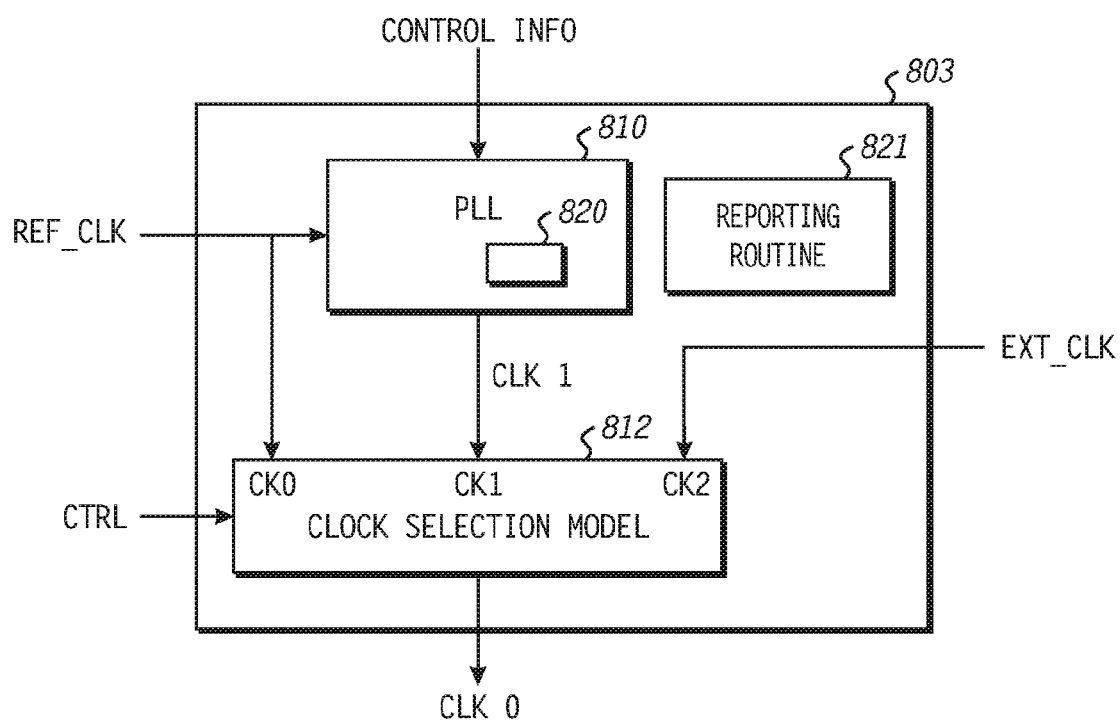
FIG. 7 is a diagram of a particular embodiment of a power mode status report based on the specification of FIG. 5 and the simulation results of FIG. 6.
FIG. 8 is a diagram of an alternate embodiment of the clock control module of FIG. 2.

Referring to FIGS. 5-7, diagrams illustrating a power mode specification for a simulated device, simulation results associated with the simulated device, and a status report based on the results are illustrated. FIG. 5 illustrates a particular embodiment of a power mode specification 500 for a simulated device, such as the hardware device 102 of FIG. 1. As illustrated, the power mode specification 500 includes a row

502 indicating a specified power mode and a column 504 indicating a clock control module of the device 102. Each entry in the power mode specification indicates a specified enable status for a clock control module in a particular mode. The designation "E" indicates that the clock control module should be enabled, the designation "D" indicates that the clock control module should be disabled. It will be appreciated that in other embodiments the specification can include more information than whether a clock control module is enabled, including clock frequency, clock phase, timing information concerning when a clock control module should be enabled or disabled, and the like. It will further be appreciated that, in an alternative embodiment, clock control modules having the same specified behavior in each power mode are represented by a single clock control module in the power mode specification 500.

Referring to FIG. 6, a diagram of a particular embodiment of simulated results 600 for the device 102 is illustrated. The simulated results 600 include a row 602 indicating a simulated power mode of the device and a column 604 indicating a clock control module being simulated. The simulated results 600 can be developed based on the clock status data 110 of FIG. 1. For example, the state data stored in the clock status data can be analyzed by a software tool to determine when the simulator 108 was simulating the device 102 in each power mode, and the enable state of each clock control module in each power mode.

As illustrated, each entry in the simulated results 600 indicates whether a clock control module is enabled in a particular mode. The designation "E" indicates that the clock control module is enabled (i.e. is providing a clock signal at an output) while the designation "D" indicates that the clock control module is disabled (i.e. is not providing a clock signal at its output) in the associated mode. The simulated results also illustrate, in row 606, the enable status for a clock control module, CCM_NEW that does not have specified behavior in the power mode specification 500 of FIG. 5.

A software analysis tool can compare the simulated results 600 with the power mode specification 500 to develop a status report. A particular embodiment of a status report 700 is illustrated in FIG. 7. The status report 700 includes a row 702 indicating a simulated power mode and a column 704 indicating a simulated clock control module. Each entry in the table indicates whether a particular clock control module matches the specified behavior in a particular power mode. A designation "P" indicates that the simulated operation of the clock control module in the associated power mode matches the specified behavior. A designation "F" indicates that the simulated operation does not match the specified behavior. Further, a designation N indicates that no specified behavior was determined for the clock control module in the associated power mode.

The status report 700 can be used to determine the compliance of a simulated design to a design specification. For example, entry 720 indicates that the reported status of CCM 303 in the simulated power mode M5, as indicated by the simulated results 600, matches the specified behavior indicated by the power mode specification 500. Entry 730, in contrast, indicates that the reported status of CCM 304 does not match the specified behavior in simulated power mode M4. This can indicate problems with the design implementation, or with the design specification.

In addition, the status report 700 can be used to quickly identify clock control modules for which there is no specified behavior. For example, row 706 indicates that the clock control module CCM_NEW does not have any specified behavior in the power mode specification 500. This can indicate that a new clock control module has been placed into a design, and that its behavior has yet to be specified. This can be helpful in the design of complex devices that are designed by a team. Each designer in the team can be working on the design of disparate portions of the device 102, and can create clock control modules for a particular portion. The clock status data 110 and the status report 700 provide for a reporting mechanism that allows for the creation of new clock control modules to be tracked, even if each module is created by different designers or design teams. The status report 700 can also indicate other results, such as whether a clock control module has been removed from a design, whether a particular mode has been tested by a simulation, and the like.

Referring to FIG. 8, a block diagram of a particular embodiment of a clock control model 803 is illustrated. The clock control model 803 includes a phase locked loop (PLL) 810 and a clock selector module 812. The PLL includes an input to receive control information, such as information to set the frequency of the PLL output, an input to receive a reference clock signal REF_CLK, and an output to provide a clock signal CLK1. The clock selection model 812 includes an input (CK0) to receive the clock signal REF_CLK, an input (CK1) to receive the clock signal CLK1 and an input (CK2) to receive a clock signal EXT_CLK. The clock selection model 812 also includes a control input to receive a control signal CTRL and an output to provide a clock signal CLK0. In addition the clock control model 803 includes a reporting routine 821.

The PLL 810 includes a register 820 whose contents may be set via the control information. The PLL 810 includes additional logic to provide the clock signal CLK1 based on the clock signal REF_CLK and the contents of the register 820. In a particular embodiment, the value stored in the register 820 determines the frequency of CLK0, while the phase is based on the REF_CLK signal.

The clock selection model 812 includes logic to selectively apply, based on the signal CTRL, the signals received at the inputs CK0, CK1, and CK2 to the output. Accordingly, based on the CTRL signal, any of the clock signals REF_CLK, CLK1, and EXT_CLK can be provided as the signal CLK0.

During simulation, the reporting routine 821 can report simulated power states of the clock control model 803 automatically and directly to the clock status data 110 (FIG. 1). The simulated power states can indicate a variety of information about the simulated behavior of the behavioral model 803, including the value stored in the register 820, the input selected at the clock selection model 812, and other information. Because these states are recorded automatically, rather than through analysis of input/output data or through probing of particular inputs and outputs of the behavioral model 803, the simulated behavior of the clock control module 803 can be more easily and accurately analyzed.

Figure 9:
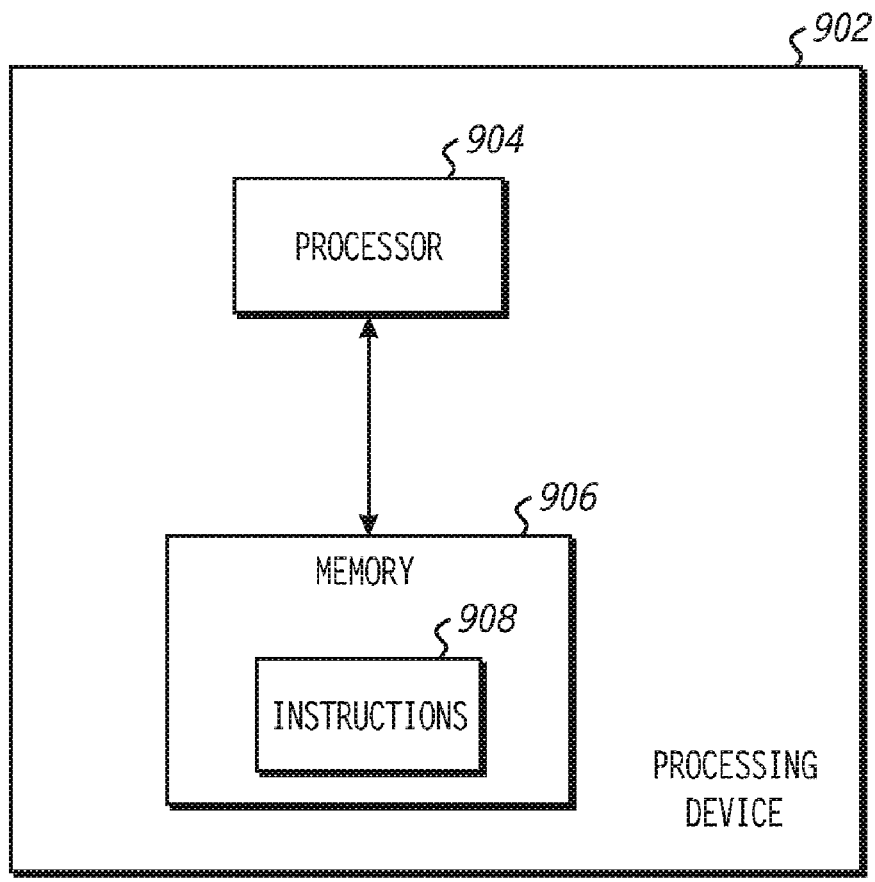
FIG. 9 is a block diagram of a processing device in accordance with one embodiment of the present disclosure.

Referring to FIG. 9, a block diagram of a particular embodiment of a processing device 902. The processing device 902 includes a processor 904 and a memory 906. The memory 906 is accessible to the processor 902. The processing device 902 may also include additional components (not shown) or be connected to peripheral devices (not shown) such as input/output controllers, memory controllers, and the like.

The memory 906 is a computer readable medium, such as RAM memory, ROM memory, non-volatile memory such as flash memory or a hard drive, and the like. The memory 906 includes a set of instructions 908 that can manipulate the processor 904. During operation, the set of instructions 908 manipulate the processor 104 to execute one or more of the methods disclosed herein.

The disclosure has been described with reference to specific embodiments. However, it will be appreciated that various modifications and changes can be made without departing from the scope of the present disclosure as set forth in the claims below. For example, although a reporting routine has been described as monitoring the output of a clock control model to determine a power state, the reporting routine can also determine the power state by monitoring the inputs of the clock control model, the outputs of the clock model, or a combination thereof. Further, voltage or current switches or other devices can also be modeled to determine power consumption behavior. In addition, the connections as discussed herein may be illustrated or described in reference to being a single connection, a plurality of connections, unidirectional connections, or bidirectional connections. Further, a plurality of connections may be replaced with single a connection that transfers multiple signals serially or in a time-multiplexed manner. Likewise, single connections carrying multiple signals may be separated out into various different connections carrying subsets of these signals. Therefore, many options exist for transferring signals. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the spirit and scope of the disclosure.

What is claimed is:

1. A method, comprising:
   simulating operation of a device based on a simulation model of the device, the simulation model comprising a plurality of clock control modules, the plurality of clock control modules comprising a first clock control module;
   automatically receiving a first indicator from a first clock control model during simulation indicating a first simulated power state of the first clock control module, wherein the first clock control model simulates the first clock control module;
   comparing the first indicator to a power mode specification comprising a plurality of expected values including a first expected value; and
   generating a second indicator in response to determining the first indicator does not match the first expected value.

2. The method of claim 1, further comprising:
   generating a third indicator in response to determining that the first clock control model does not have any specified behavior.

3. The method of claim 1, further comprising:
   generating a third indicator in response to determining the first indicator matches the first expected value.

4. The method of claim 1, wherein simulating operation of the device comprises simulating operation of the device in a first power mode.

5. The method of claim 4, wherein simulating operation of the device comprises simulating operation of the device in a second power mode.

6. The method of claim 5, wherein the first power mode is an active power and the second power mode is a low-power mode.

7. The method of claim 5, wherein the first power mode is a power-on-reset mode.

8. The method of claim 5, wherein receiving the first indicator comprises receiving the first indicator during simulation of the first power mode, and further comprising receiving during simulation of the second power mode a third indicator from the first clock control model, the third indicator indicating a second simulated enable state of the first clock control module.

9. The method of claim 8, further comprising:
   comparing the second indicator to the power mode specification;
   generating a third indicator in response to determining the second indicator does not match a second expected value of the plurality of expected values.

10. The method of claim 9, further comprising generating a fourth indicator in response to determining that the second indicator matches the second expected value.

11. The method of claim 1, further comprising:
    automatically receiving a third indicator from a second clock control model during simulation indicating a second simulated enable state, wherein the second clock control model simulates a second clock control module of the plurality of clock gating cells.

12. The method of claim 11, further comprising:
    comparing the first indicator and the third indicator to the power mode specification, the plurality of expected values including a second expected value; and
    generating a fourth indicator in response to determining the third indicator does not match the second expected value.

13. The method of claim 11, wherein simulating operation of the device comprises simulating operation of the device in a first power mode and in a second power mode and wherein the first and third indicators are received during simulation of the first power mode.

14. The method of claim 13, further comprising:
    automatically receiving a fifth indicator from the first clock gating cell module during simulation of the second power mode indicating a third simulated enable state of the first clock gating cell; and
    automatically receiving a sixth indicator from the second clock gating cell module during simulation of the second power mode indicating a fourth simulated enable state of the second clock gating cell.

15. The method of claim 1, wherein the simulation model is a register transfer level (RTL) model.

16. A computer readable medium that stores a computer program, the computer program comprising instructions to manipulate a processor, the instructions comprising:
    instructions to simulate operation of a device, the device comprising a plurality of clock control modules, the plurality of clock control modules comprising a first clock control module; and
    instructions to automatically receive a first indicator from a first clock control model during simulation indicating a first simulated power state of the first clock control module, wherein the first clock control model simulates the first clock control module;
    instructions to compare the first indicator to a power mode specification comprising a plurality of expected values including a first expected value; and instructions to generate a second indicator in response to determining the first indicator does not match the first expected value.

17. The computer readable medium of claim 16, wherein the instructions to simulate operation of the device comprise instructions to simulate operation of the device in a first power mode and instructions to simulate operation of the device in a second power mode.

18. The computer readable medium of claim 16, wherein the instructions to receive the first indicator comprise instructions to receive the first indicator during simulation of a first power mode, and wherein the computer program further comprises instructions to receive a third indicator from the first clock control model during simulation of a second power mode, the third indicator indicating a second simulated enable state of the first clock control module.

19. A method, comprising:
simulating operation of a device based on a simulation model of the device, the simulation model comprising a plurality of clock control modules, the plurality of clock control modules comprising a first clock control module; and
automatically receiving a first indicator from a first clock control model during simulation indicating a first simulated power state of the first clock control module, wherein the first clock control model simulates the first clock control module.

20. The method of claim 19, wherein simulating operation of the device comprises simulating operation of the device in an active power mode and in a low-power mode.

* * * * *